(12) United States Patent
Kim

(10) Patent No.: US 9,059,428 B2
(45) Date of Patent: Jun. 16, 2015

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventor: Eun-Jeong Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/058,931

(22) Filed: Oct. 21, 2013

(65) Prior Publication Data
US 2015/0001475 A1    Jan. 1, 2015

(30) Foreign Application Priority Data

Jun. 26, 2013 (KR) .......................... 10-2013-0073971

(51) Int. Cl.
| | |
|---|---|
| H01L 29/08 | (2006.01) |
| H01L 51/52 | (2006.01) |
| H01L 27/32 | (2006.01) |
| H01L 51/56 | (2006.01) |

(52) U.S. Cl.
CPC ............ *H01L 51/5237* (2013.01); *H01L 27/32* (2013.01); *H01L 51/5203* (2013.01); *H01L 51/56* (2013.01)

(58) Field of Classification Search
CPC .. H01L 51/0545; H01L 51/52; H01L 27/3248
USPC .................. 257/40, 59, 72, E51.018; 438/34
See application file for complete search history.

(56) References Cited

U.S. PATENT DOCUMENTS

| | | | |
|---|---|---|---|
| 8,278,818 B2 | 10/2012 | Jeong et al. | |
| 2011/0121301 A1 | 5/2011 | Kim et al. | |
| 2011/0278558 A1* | 11/2011 | Hamada .......................... | 257/40 |
| 2013/0234917 A1* | 9/2013 | Lee ................... | 345/82 |
| 2013/0285042 A1* | 10/2013 | Komatsu et al. ................. | 257/40 |

FOREIGN PATENT DOCUMENTS

| | | |
|---|---|---|
| KR | 10-2005-0115705 | 12/2005 |
| KR | 10-0810645 | 7/2008 |
| KR | 10-2011-0058407 | 6/2011 |
| KR | 10-2011-0077838 | 7/2011 |

* cited by examiner

*Primary Examiner* — Fernando L Toledo
*Assistant Examiner* — Adam S Bowen
(74) *Attorney, Agent, or Firm* — F. Chau & Associates, LLC

(57) ABSTRACT

An organic light-emitting display apparatus includes a substrate. A pixel electrode is disposed on the substrate. A pixel defining layer covers an edge of the pixel electrode and exposes at least a first portion of the edge. A first intermediate layer is disposed on the pixel electrode and covers a central part and the first portion of the pixel electrode. An auxiliary insulating layer is disposed on the first intermediate layer and covers a portion of the first intermediate layer corresponding to the at least the first portion. An emission layer is disposed on the first intermediate layer corresponding to the central part of the pixel electrode. An opposite electrode faces the pixel electrode. The first intermediate layer is disposed between.

20 Claims, 4 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority to Korean Patent Application No. 10-2013-0073971, filed on Jun. 26, 2013, in the Korean Intellectual Property Office, the disclosure of which is herein incorporated by reference in its entirety.

TECHNICAL FIELD

The present invention relates to a display apparatus, and more particularly, to an organic light-emitting display apparatus and a method of manufacturing the same.

DISCUSSION OF THE RELATED ART

In general, organic light-emitting display apparatuses have a relatively wide angle of view, good contrast, and a quick response speed. Thus the organic light-emitting display apparatuses receive attention as next-generation display apparatuses.

An organic light-emitting display apparatus has a structure in which an intermediate layer including an emission layer is interposed between a first electrode and a second electrode that faces the first electrode. In this case, the intermediate layer may be formed by various methods, one of which is spin coating. When an organic light-emitting display apparatus is manufactured by spin coating, an intermediate layer may be formed by dropping ink on a substrate on which the intermediate layer is to be formed and rotating the substrate to spread the ink.

SUMMARY OF THE INVENTION

The present invention provides an organic light-emitting display apparatus for planarizing a thin film by solving non-uniformity of the thin film and a method of manufacturing the same. However, these features are only illustrative, and the scope of the present invention is not limited thereto.

According to an aspect of the present invention, there is provided an organic light-emitting display apparatus including a substrate. A pixel electrode is disposed on the substrate. A pixel defining layer covers an edge of the pixel electrode and exposes at least a first portion of the edge. A first intermediate layer is disposed on the pixel electrode and covers a central part and the first portion of the pixel electrode. An auxiliary insulating layer is disposed on the first intermediate layer and covers a portion of the first intermediate layer corresponding to the at least the first portion. An emission layer is disposed on the first intermediate layer and corresponds to the central part of the pixel electrode. An opposite electrode faces the pixel electrode. The first intermediate layer is interposed between the pixel electrode and the opposite electrode.

The organic light-emitting display apparatus may further include a second intermediate layer. The auxiliary insulating layer and the emission layer may share a common top level. The second intermediate layer covers the emission layer and the auxiliary insulating layer.

The pixel defining layer may have a pixel part that exposes the central part of the pixel electrode and a passage part that exposes the first portion of the pixel electrode.

The organic light-emitting display apparatus may further include an adjacent pixel electrode that is adjacent to the pixel electrode. The passage part may connect the central part of the pixel electrode and a central part of the adjacent pixel electrode.

The passage part may be curved in a curve shape.

The auxiliary insulating layer may have an aperture that exposes the pixel part of the pixel defining layer.

The aperture of the auxiliary insulating layer may share a common inner side surface with the pixel part of the pixel defining layer.

The pixel defining layer may further expose second, third, and fourth portions of the pixel electrode.

According to an aspect of the present invention, there is provided a method of manufacturing organic light-emitting display apparatus. The method includes forming a pixel electrode on a substrate. A pixel defining layer is formed covering an edge of the pixel electrode and the pixel defining layer exposes at least a first portion of the edge. A first intermediate layer is formed on the pixel electrode and covers a central part and the first portion of the pixel electrode. An auxiliary insulating layer is disposed on the first intermediate layer and covers a portion of the first intermediate layer corresponding to the at least the first portion. An emission layer is disposed on the first intermediate layer and corresponds to the central part of the pixel electrode. An opposite electrode is formed facing the pixel electrode. The intermediate layer is interposed between the pixel electrode and the opposite electrode.

The method may further include forming a second intermediate layer. The auxiliary insulating layer and the emission layer may share a common top level. The second intermediate layer may cover the emission layer and the auxiliary insulating layer.

The forming of the pixel defining layer may include forming a pixel part that exposes the central part of the pixel electrode and a passage part that exposes the first portion of the pixel electrode.

The forming of the pixel defining layer may further include forming an adjacent pixel electrode that is adjacent to the pixel electrode. The passage part may connect the central part of the pixel electrode and a central part of the adjacent pixel electrode.

The intermediate layer may be formed by spin coating.

The passage part may be formed in a curve shape along a direction where the intermediate layer is coated.

The forming of the auxiliary insulating layer may further include forming an aperture that exposes the pixel part of the pixel defining layer.

The forming of the auxiliary insulating layer may include forming an insulating layer so that the pixel part that exposes the central part of the pixel defining layer and an aperture of the insulating layer have the same inner side surface.

The forming of the pixel defining layer may further include exposing second, third, and fourth portions of the pixel electrode.

According to an aspect of the present invention, there is provided an organic light-emitting display apparatus including a substrate. A plurality of pixel electrodes is disposed on the substrate. A pixel defining layer has a plurality of islands that are disposed respectively covering portions of edges of the plurality of pixel electrodes. A first intermediate layer is disposed on the plurality of pixel electrodes and between the plurality of islands of the pixel defining layer. An auxiliary insulating layer is disposed on the first intermediate layer and corresponds to at least the plurality of islands of the pixel defining layer. An emission layer is disposed on the first intermediate layer and corresponds to a central part of each of the plurality of pixel electrodes. An opposite electrode faces the plurality of pixel electrodes and the first intermediate layer is interposed between the plurality of pixel electrodes and the opposite electrode.

The organic light-emitting display apparatus may further include a second intermediate layer. The auxiliary insulating layer and the emission layer may share a common top level. The second intermediate layer covers the emission layer and the auxiliary insulating layer.

The pixel defining layer may have a hexagonal shape.

An organic light-emitting display apparatus includes a pixel electrode disposed on a substrate. A pixel defining layer covers an edge of the pixel electrode and exposes at least a first portion of the edge of the pixel electrode. The pixel defining layer has a pixel part exposing a central part of the pixel electrode and a passage part that exposes a first portion of the pixel electrode. An intermediate layer is disposed on the pixel electrode and covers the central part of the pixel electrode and the first portion of the pixel electrode. An emission layer is disposed on the inter mediate layer corresponding to the central part of the pixel electrode. An opposite electrode faces the pixel electrode. The intermediate layer is interposed between the pixel electrode and the opposite electrode.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE INVENTION

Figure 1:
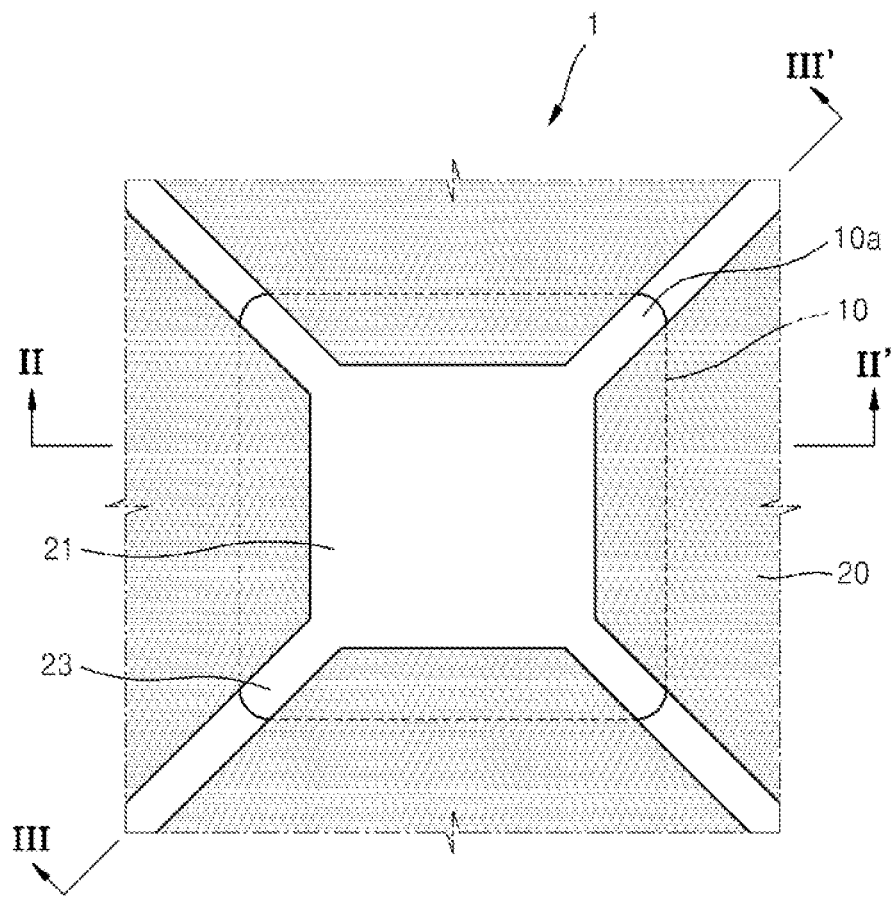
FIG. 1 is a top view of one pixel unit of an organic light-emitting display apparatus according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of components may be exaggerated or reduced for convenience of description. For example, the sizes and thicknesses of components in the drawings may be arbitrarily shown for convenience of description, the present invention is not necessarily limited to the drawings.

When it is described that a certain component, such as a layer, a film, a region, a plate, or the like, is above another component, the certain component may be directly above another component, or a third component may be interposed therebetween.

As described above, when an intermediate layer and the like of an organic light-emitting display apparatus are formed using spin coating, a thin film of a pixel unit may be non-uniform.

For example, after forming an insulation layer covering a first electrode and forming a pixel defining layer (PDL) by forming a predetermined aperture in the insulation layer exposing at least the center part of the first electrode, an intermediate layer, which includes an emission layer, and a second electrode may be sequentially formed on the first electrode exposed to the outside by the predetermined aperture. Thus, when spreading an ink including materials for forming the intermediate layer by dropping the ink on the first electrode exposed to the outside by the predetermined aperture of the PDL and then rotating a substrate, the ink may lump at an edge portion of the PDL, thereby resulting in the non-uniformity of a thin film.

Figure 2:
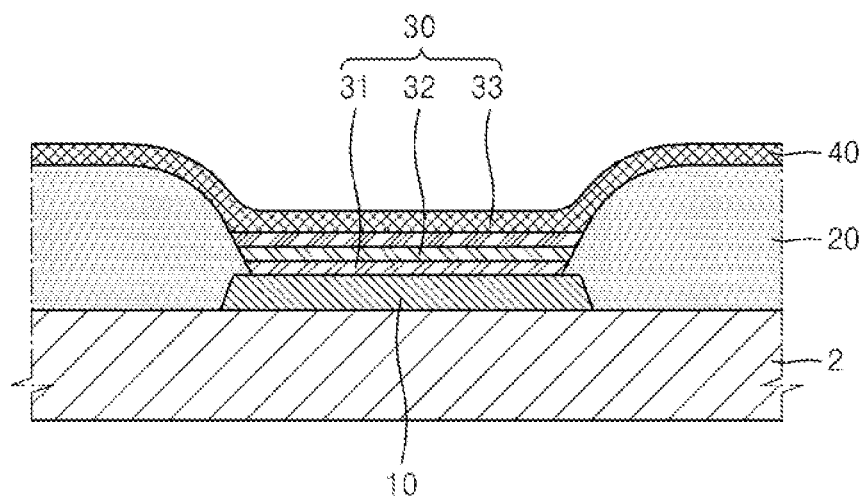
FIG. 2 is a cross-sectional view along line II-II' of the pixel unit of FIG. 1.
Figure 3:
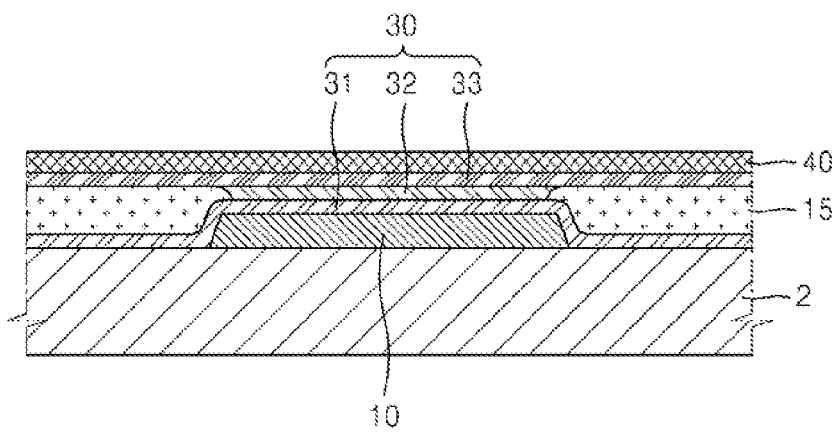
FIG. 3 is a cross-sectional view along line III-III' of the pixel unit of FIG. 1.

FIG. 1 is a top view of one pixel unit 1 of an organic light-emitting display apparatus according to an embodiment of the present invention, FIG. 2 is a cross-sectional view along line II-II' of the pixel unit 1 of FIG. 1, and FIG. 3 is a cross-sectional view along line III-III' of the pixel unit 1 of FIG. 1. Some of components shown in FIGS. 2 and 3 are omitted in FIG. 1 for convenience of drawing. For example, it will be understood that while FIG. 1 shows only a pixel electrode 10 and a pixel defining layer 20 for convenience of drawing, it is to be understood that other components may be present.

Referring to FIG. 1, FIG. 2, and FIG. 3, the organic light-emitting display apparatus includes the pixel electrode 10, the pixel defining layer 20, a first intermediate layer 31, an auxiliary insulating layer 15, an emission layer 32, and an opposite electrode 40, each of which is disposed on a substrate 2.

The substrate 2 may include a glass material, a plastic material, or a metallic material.

The pixel electrode 10 is disposed on the substrate 2. The disposition of the pixel electrode 10 on the substrate 2 may include not only a case where the pixel electrode 10 is directly disposed on the substrate 2 but also a case where pixel electrode 10 is disposed on various kinds of layers formed on the substrate 2. For example, a thin film transistor may be disposed on the substrate 2, a planarizing film may cover the thin film transistor, or the pixel electrode 10 may be disposed on the planarizing film. FIGS. 2 and 3 show for convenience of drawing that the pixel electrode 10 is directly disposed on the substrate 2, and the description hereinafter will be made as well for convenience of explanation.

The pixel electrode 10 may be a transparent electrode or a reflective electrode. When the pixel electrode 10 is a transparent electrode, the pixel electrode 10 may include a layer formed of an indium tin oxide (ITO), an indium zinc oxide (IZO), a zinc oxide (ZnO), or an indium oxide ($In_2O_3$). When the pixel electrode 10 is a reflective electrode, the pixel electrode 10 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof and a layer formed of ITO, IZO, ZnO, or $In_2O_3$.

The pixel defining layer 20 covers an edge of the pixel electrode 10 so that at least a first portion 10a of the edge of the pixel electrode 10 is exposed. For example, the pixel defining layer 20 may cover the edge of the pixel electrode 10 so that the first portion 10a of the pixel electrode 10 is exposed. The first portion 10a may be formed in a rectangular shape. For example, four apexes of the pixel electrode 10 may be formed in a rectangular shape and they may be sequentially referred to as the first portion 10a, a second portion 10b, a third portion 10c, and a fourth portion 10d. The pixel defining layer 20 may also have a pixel part 21 that exposes a central part of the pixel electrode 10 and a passage part 23 that exposes the first to fourth portions 10a to 10d of the pixel electrode 10. The passage part 23 may have a direct line shape connecting the central part of the pixel electrode 10 and a central part of another adjacent pixel electrode that is adjacent to the pixel electrode 10 based on the pixel electrode 10. However, the invention is not limited thereto, and the passage part 23 may have a curve shape.

The pixel defining layer 20 may be, for example, an organic insulating layer. The pixel defining layer 20 may include an acryl-group polymer, such as polymethylmethacrylate (PMMA), polymer derivatives having polystyrene (PS) and a phenol group, an imide-group polymer, an arylether-group polymer, an amide-group polymer, a fluorene-group polymer, a p-xylene-group polymer, a vinylalcohol-group polymer, a combination thereof, or the like.

The first intermediate layer 31 is disposed on the pixel electrode 10 and covers the central part and the first portion 10a of the pixel electrode 10. The first intermediate layer 31 may include a hole injection layer (HIL), a hole transport layer (HTL), and the like. Organic materials usable as the first intermediate layer 31 may be copper phthalocyanine (CuPc), N,N-di(naphthalene-1-yl)-N,N'-diphenylbenzidine (NPB), tris-8-hydroxyquinoline aluminum ($Alq_3$), and other various low-molecular organic materials. High-molecular organic materials may also be used, for example, poly(2,3-ethylene-dioxythiophene) (PEDOT) may be used as the HTL.

The auxiliary insulating layer 15 is disposed on the first intermediate layer 31 and covers a portion of the first intermediate layer 31 corresponding to at least the first portion 10a of the pixel electrode 10 and may also be disposed on the second to fourth portions 10b to 10d. For example, the auxiliary insulating layer 15 may be disposed on the passage part 23 and may also be disposed on the first to fourth portions 10a to 10d.

The auxiliary insulating layer 15 may be an organic insulating layer. The auxiliary insulating layer 15 may include an acryl-group polymer, such as PMMA, polymer derivatives having polystyrene (PS) and a phenol group, an imide-group polymer, an arylether-group polymer, an amide-group polymer, a fluorene-group polymer, a p-xylene-group polymer, a vinylalcohol-group polymer, a combination thereof, or the like.

The emission layer 32 may be disposed on the first intermediate layer 31 to correspond to the central part of the pixel electrode 10. The opposite electrode 40 may be disposed so that the first intermediate layer 31 and the emission layer 32 are interposed between the opposite electrode 40 and the pixel electrode 10.

The emission layer 32 may have a patterned shape, e.g., an island shape, for each pixel. For example, the emission layer 32 may be formed in a space limited by the pixel defining layer 20 and the auxiliary insulating layer 15. The emission layer 32 may be referred to as emission material layer (EML), and organic materials usable as the emission layer 32 may be copper phthalocyanine (CuPc), N,N-di(naphthalene-1-yl)-N, N'-diphenylbenzidine (NPB), tris-8-hydroxyquinoline aluminum ($Alq_3$), and other various low-molecular organic materials.

The opposite electrode 40 may have a one-body shape on a plurality of pixel electrodes 10 to correspond to the plurality of pixel electrodes 10. The opposite electrode 40 may also be or include a transparent electrode or a reflective electrode. When the opposite electrode 40 is a transparent electrode, the opposite electrode 40 may include a layer formed of lithium (Li), calcium (Ca), lithium fluoride (LiF)/Ca, LiF/Al, Ag, Mg, or a compound thereof and a layer formed of a transparent electrode forming material, such as ITO, IZO, ZnO, or $In_2O_3$. When the opposite electrode 40 is a reflective electrode, the opposite electrode 40 may include a layer formed of Li, Ca, LiF/Ca, LiF/Al, Ag, Mg, or a compound thereof.

FIG. 2 is a cross-sectional view along line II-II' of the pixel unit 1 of FIG. 1. The pixel electrode 10 may be disposed on the substrate 2, and the pixel defining layer 20 may be disposed on the substrate 2 covering the edge of the pixel electrode 10. The first intermediate layer 31 and the emission layer 32 may be sequentially disposed on the pixel electrode 10. A second intermediate layer 33 may be disposed on the emission layer 32. For example, the pixel defining layer 20 may be formed to be terraced higher than the second intermediate layer 33. The first intermediate layer 31, the emission layer 32, and the second intermediate layer 33 sequentially formed on the pixel electrode 10 may together be referred to as an intermediate layer 30 of the organic light-emitting display apparatus according to an embodiment of the present invention. The opposite electrode 40 may be disposed on the intermediate layer 30.

The pixel electrode 10 functions as an anode electrode, and the opposite electrode 40 functions as a cathode electrode, and the polarities of the pixel electrode 10 and the opposite electrode 40 may be reversed from the manner described.

The intermediate layer 30 may be formed by spin coating. For example, the intermediate layer 30 may be formed by coating an organic material to cover the pixel electrode 10 and the pixel defining layer 20 and then rotating the substrate 2.

The intermediate layer 30 may be formed of a low-molecular organic material such as described above. For example, the intermediate layer 30 may be formed by laminating an HIL, an HTL, and EML, an electron transport layer (ETL), and an electron injection layer (EIL) in a single or combination structure. In an embodiment of the present invention, it may be understood that the first intermediate layer 31 includes at least one of the HIL and the HTL, and it may be understood that the second intermediate layer 33 includes at least one of the ETL and the EIL.

The intermediate layer 30 is not necessarily limited thereto, and various embodiments may be of course applicable.

FIG. 3 is a cross-sectional view along line III-III' of the pixel unit 1 of FIG. 1, and as shown in FIG. 3, the pixel defining layer 20 is not shown in the cross-sectional view along the line III-III'. Hereinafter, the pixel defining layer 20 of the organic light-emitting display apparatus according to an embodiment of the present invention will be described.

The pixel defining layer 20 indicates a patterned insulating layer that functions to more accurately define an emission region when an organic light-emitting display apparatus is manufactured. Referring to FIG. 2, the pixel defining layer is manufactured to be slanted with a predetermined angle from a substrate to remove a shadow effect occurring during a deposition process. Thus, pixel defining layers of organic light-emitting display apparatuses may be manufactured to have a direct line shape and to be slanted with respect to a substrate.

A spin coating process may be used to form a uniform thin film by uniformly spreading a solution on a substrate and rotating the substrate. Spin coating may be used to form an intermediate layer. The thickness of an organic layer actually formed by such a solution process may be of the order of tens of nm, and the thickness of a pixel defining layer may be of the order of hundreds of nm to thousands of nm, and thus, the pixel defining layer acts as a very high barrier in a process of forming the organic layer. When such a barrier exists, the solution rises along the barrier by surface tension, and thus, both ends of the intermediate layer are formed to sharply protrude along the pixel defining layer, thereby decreasing the uniformity of the intermediate layer. For example, when a method of forming an intermediate layer by rotation, such as spin coating, is used, the pixel defining layer may cause a back flow of a solvent, thereby decreasing the uniformity of the intermediate layer. Furthermore, a distribution of the process may be large and an emission surface may become uneven when an organic light-emitting display device is manufactured.

However, in the organic light-emitting display apparatus according to an embodiment of the present invention, the pixel defining layer 20 does not exist in some regions as shown in FIG. 3, and thus, the occurrence of the phenomenon described above may be prevented or reduced.

Figure 4:
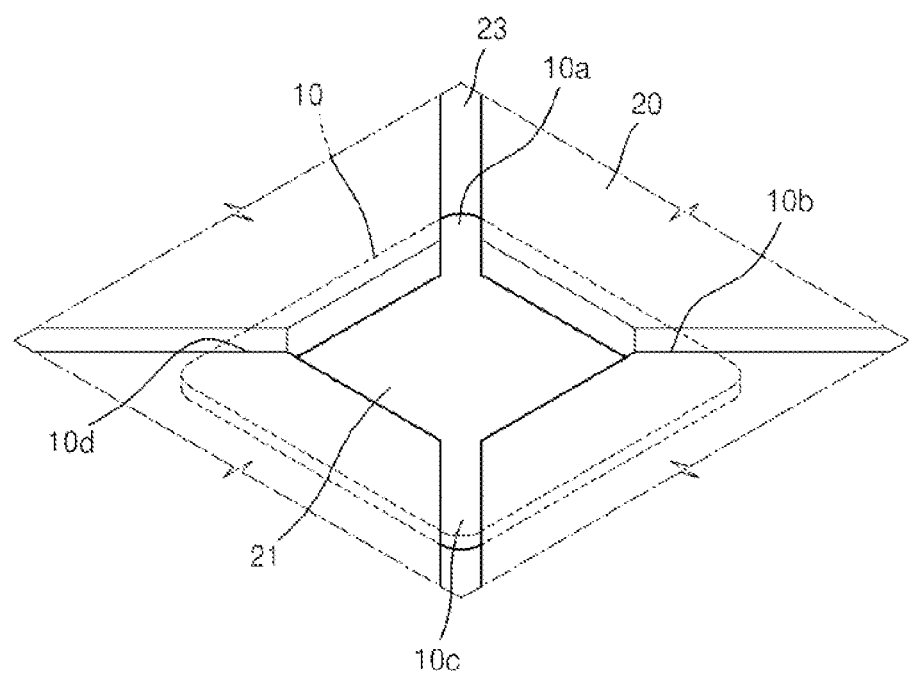
FIG. 4 is a perspective view of a portion of one pixel unit.

For example, in the organic light-emitting display apparatus according to an embodiment of the present invention, as shown in FIGS. 1, 3, and 4, the first to fourth portions 10a to 10d of the pixel electrode 10 are exposed through the passage part 23 of the pixel defining layer 20. The entire central part of the upper surface of the pixel electrode 10 and a portion of the edge that forms corners of the pixel electrode 10 are exposed through an aperture that forms the pixel part 21 and the passage part 23 of the pixel defining layer 20, respectively.

The first intermediate layer 31 may be disposed on the pixel electrode 10 and may cover the central part and the first to fourth portions 10a to 10d of the pixel electrode 10. In this case, when the first intermediate layer 31 is formed by spin coating, a material for forming the first intermediate layer 31 flows through passages connecting a plurality of pixel electrodes 10 to each other by passing through the passage part 23 of the pixel defining layer 20. Accordingly, when the first intermediate layer 31 is formed by spin coating, the occurrence of the back flow phenomenon at the edge of the pixel defining layer 20 may be prevented or remarkably reduced, thereby uniformly forming the intermediate layer 30.

Unlike the first intermediate layer 31, the emission layer 32 may have an island shape corresponding to each pixel electrode 10. Thus, when the emission layer 32 is formed, a material for forming the emission layer 32 needs not flow over to an adjacent pixel electrode 10 from one pixel electrode 10 through the passage part 23. Thus, the auxiliary insulating layer 15 may be further disposed on the passage part 23 so that the emission layer 32 of each pixel unit 1 is separately disposed.

The auxiliary insulating layer 15 may be further disposed on the first intermediate layer 31 and may cover a portion corresponding to the first to fourth portions 10a to 10d of the pixel electrode 10. In this case, the auxiliary insulating layer 15 may also be disposed on the passage part 23.

Since an emission layer of one pixel may flow over to an emission layer of another pixel through the passage part 23 formed on the pixel defining layer 20, the auxiliary insulating layer 15 is disposed to prevent the "flow over". In this case, a top level of the auxiliary insulating layer 15 may be the same as that of the emission layer 32. This is because since the auxiliary insulating layer 15 functions to prevent emission layers of pixels from mixing as described above, if the auxiliary insulating layer 15 is formed to be much thicker than the emission layer 32, when the second intermediate layer 33 is formed later by spin coating, the back flow phenomenon occurs at an edge of the auxiliary insulating layer 15 to thereby form the second intermediate layer 33 to be thick, and thus, it might be difficult to secure the uniformity of a thin film that is a target of the present invention.

The auxiliary insulating layer 15 has an aperture that exposes the pixel part 21 of the pixel defining layer 20. As described above, the emission layer 32 is disposed on the aperture of the auxiliary insulating layer 15. In detail, referring to FIG. 5 below, the aperture of the auxiliary insulating layer 15 may share a common inner side surface with the pixel part 21 of the pixel defining layer 20.

According to this structure, when the intermediate layer 30 is formed on the pixel electrode 10 by spin coating, the intermediate layer 30 is spread towards the first to fourth portions 10a to 10d formed at the apexes of the pixel electrode 10, and thus, the intermediate layer 30 may be prevented from being thick at the edge of the pixel defining layer 20.

A case where there are four passage parts 23 in correspondence with each pixel electrode 10 has been described above. However, the present invention is not limited thereto, and the number of passages may be variable according to circumstances. For example, passages may exist at only two facing apexes from among the four apexes of each pixel electrode 10 or at two sides from among the four sides of each pixel electrode 10 instead of the apexes.

Although exemplary embodiments of the organic light-emitting display apparatus have been described, the present invention is not limited thereto. For example, the present invention may also include a method of manufacturing the organic light-emitting display apparatus.

Figure 5:
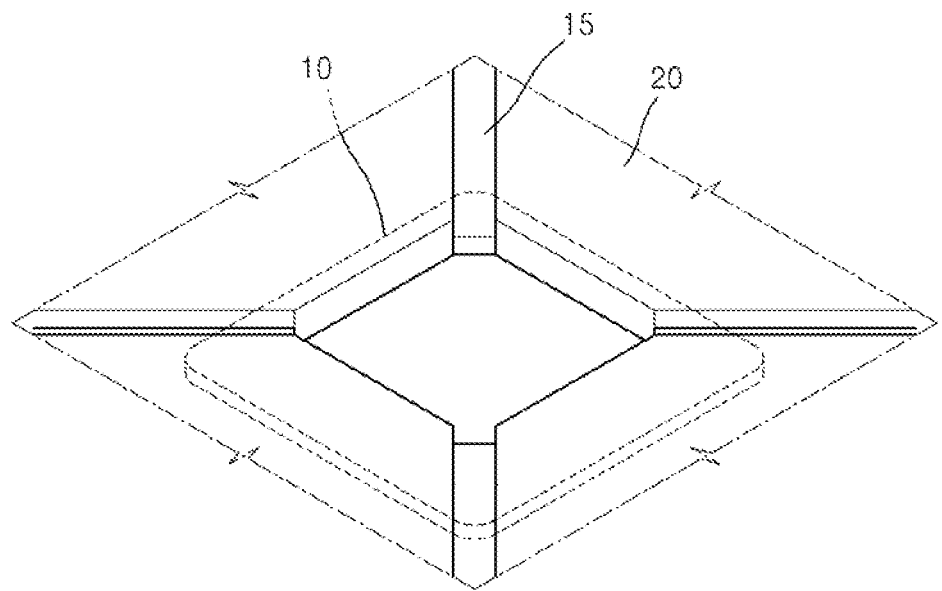
FIG. 5 is a perspective view of a portion of one pixel unit.
Figure 6:
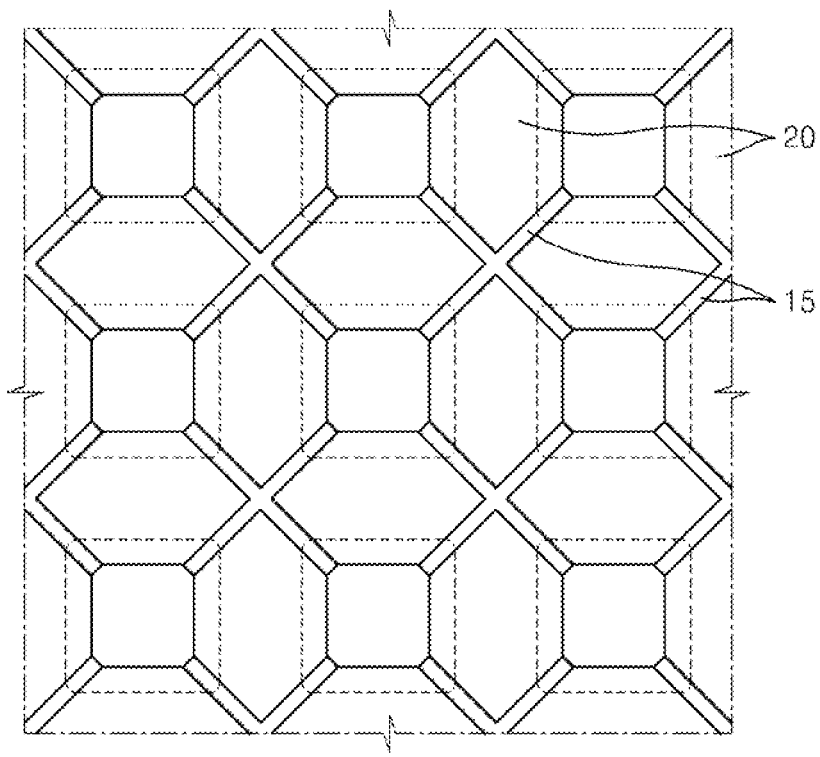
FIG. 6 is a top view of a plurality of pixel units of an organic light-emitting display apparatus according to an embodiment of the present invention.

FIG. 4 is a perspective view of one pixel unit, FIG. 5 is a perspective view of the pixel unit of FIG. 4 to which the auxiliary insulating layer 15 is further deposited, and FIG. 6 is a top view of a plurality of pixel units of an organic light-emitting display apparatus according to an embodiment of the present invention.

In a method of manufacturing the organic light-emitting display apparatus according to an embodiment of the present invention, as shown in FIG. 4, after preparing the substrate 2, forming the pixel electrode 10 on the substrate 2 may be performed, and forming the pixel defining layer 20 to cover the edge of the pixel electrode 10 and expose at least the first portion 10a may be performed.

The forming of the pixel defining layer 20 may include further exposing the second portion 10b, the third portion 10c, and the fourth portion 10d based on the first portion 10a in addition to the first portion 10a. The forming of the pixel defining layer 20 may also include forming the pixel part 21 that exposes the central part of the pixel electrode 10 and the passage part 23 that exposes at least the first portion 10a of the pixel electrode 10. In this case, the pixel part 21 may have a rectangular shape, and the first to fourth portions 10a to 10d of the pixel electrode 10 may be formed to be disposed at the apexes of the pixel electrode 10.

When the passage part 23 is formed, the passage part 23 may be formed at each of the first to fourth portions 10a to 10d, and the passage parts 23 formed at the first to fourth portions 10a to 10d may be formed to connect the central part of the pixel electrode 10 and a central part of an adjacent pixel electrode that is adjacent to the pixel electrode 10 as shown in FIG. 6. In this case, the passage parts 23 may be formed in a direct line shape extending from the central part of the pixel electrode 10 to the central part of the adjacent pixel electrode that is adjacent to the pixel electrode 10 or formed to be curved in a curve shape along a direction of coating the intermediate layer 30 by spin coating.

Thereafter, as shown in FIG. 5, forming the first intermediate layer 31 disposed on the pixel electrode 10 to cover the central part and the first portion 10a of the pixel electrode 10 may be performed, and forming the auxiliary insulating layer 15 disposed on the first intermediate layer 31 to cover a portion of the first intermediate layer 31 corresponding to the first to fourth portions 10a to 10d may be performed.

In this case, the forming of the auxiliary insulating layer 15 may further include forming the second intermediate layer 33 disposed on the emission layer 32 to cover the emission layer 32 and at least a portion of the first to fourth portions 10a to 10d so that the auxiliary insulating layer 15 and the emission layer 32 have the same top level.

The forming of the auxiliary insulating layer 15 may also include forming an aperture that exposes the pixel part 21 of the pixel defining layer 20. In this case, the auxiliary insulating layer 15 may be formed so that the pixel part 21 of the pixel defining layer 20 and the aperture of the auxiliary insulating layer 15 that expose the central part of the pixel electrode 10 have the same inner side surface.

As described above, the first intermediate layer 31, the emission layer 32, and the second intermediate layer 33 formed on the pixel electrode 10 may be referred to as the intermediate layer 30 of the organic light-emitting display apparatus according to an embodiment of the present invention. The forming of the intermediate layer 30 may be performed by spin coating.

Thereafter, forming the emission layer 32 disposed on the first intermediate layer 31 to correspond to the central part of the pixel electrode 10 may be performed, and forming the opposite electrode 40 that faces the pixel electrode 10 by interposing the intermediate layer 30 therebetween.

The organic light-emitting display apparatus may be considered in terms of the pixel defining layer 20 with reference to FIG. 6.

First, the substrate 2 and a plurality of pixel electrodes 10 disposed on the substrate 2 may be prepared, and the pixel defining layer 20 having a plurality of islands may be disposed to cover a portion of an edge of each of the plurality of pixel electrodes 10. In this case, the pixel defining layer 20 having the plurality of islands may have a hexagonal shape. However, the present invention is not necessarily limited thereto.

The first intermediate layer 31 may be disposed between the plurality of pixel electrodes 10 and the plurality of islands of the pixel defining layer 20. In this case, the auxiliary insulating layer 15 disposed on the first intermediate layer 31 may be between at least the plurality of islands of the pixel defining layer 20. As described above, the second intermediate layer 33 disposed on the emission layer 32 may cover the emission layer 32 and the first to fourth portions 10a to 10d so that the auxiliary insulating layer 15 and the emission layer 32 have the same top level.

Although it has been described that the intermediate layer 30 includes the first intermediate layer 31, the emission layer 32, and the second intermediate layer 33, the present invention is not limited thereto. For example, in an organic light-emitting display apparatus according to an embodiment of the present invention, the intermediate layer 30 may include only the first intermediate layer 31 and the emission layer 32. For example, the first intermediate layer 31 may include an HIL and an HTL, and the emission layer 32 may be disposed on the first intermediate layer 31.

In this case, the first intermediate layer 31 and the emission layer 32 may be formed of a high-molecular organic material besides the low-molecular organic material described above, and the high-molecular organic material may have a including an HTL and an EML. In this case, PEDOT may be used as the HTL, and a poly-phenylenevinylene-group high-molecular organic material, a polyfluorene-group high-molecular organic material, or the like may be used as the EML.

Figure 7:
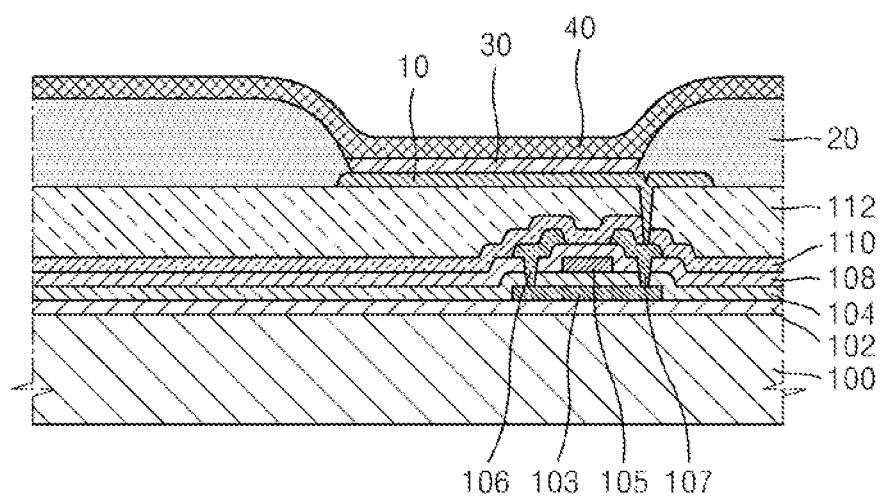
FIG. 7 is a cross-sectional view of an organic light-emitting display apparatus manufactured in a method as shown in FIG. 1.

FIG. 7 is a cross-sectional view of an organic light-emitting display apparatus as shown in FIG. 1 or the like. Although it has been illustrated in FIG. 1, for convenience of drawing, that the pixel electrode 10 is disposed on the substrate 2, the present invention is not limited thereto. For example, as shown in FIG. 7, a thin film transistor (TFT) may be disposed on a substrate 100, a planarizing film 112 may cover the TFT, and the pixel electrode 10 may be disposed on the planarizing film 112.

Referring to FIG. 7, various kinds of components of the organic light-emitting display apparatus are formed on the substrate 100. The substrate 100 may be the substrate 2 described with reference to FIG. 2 or the like or be a portion obtained by cutting the substrate 2. The substrate 100 may be formed of a transparent material, for example, a glass material, a plastic material, or a metallic material.

Common layers, such as a buffer layer 102, a gate insulating layer 104, an interlayer insulating layer 108, a protective film 110, and the like, may be formed on the entire surface of the substrate 100, a patterned semiconductor layer 103 including a channel region, a source contact region, and a drain contact region may be formed on the substrate 100, and a gate electrode 105, a source electrode 106, and a drain electrode 107 that are components of the TFT together with the patterned semiconductor layer 103 may be formed on the substrate 100.

The planarizing film 112 having an approximately planarized upper surface may be formed on the entire surface of the substrate 100 to cover the TFT. An organic light-emitting diode (OLED) including a patterned pixel electrode 10, an opposite electrode 40 approximately corresponding to the entire surface of the substrate 100, and an intermediate layer 30 of a multi-layer structure that is interposed between the pixel electrode 10 and the opposite electrode 40 and includes an emission layer may be formed on the planarizing film 112. Unlike the approach shown in the drawing, the intermediate layer 30 may have some layers that are common layers approximately corresponding to the entire surface of the substrate 100 and the intermediate layer 30 may have other layers that are pattern layers patterned to correspond to the pixel electrode 10. The pixel electrode 10 may be electrically connected to the TFT through a via hole. The pixel defining layer 20 that covers the edge of the pixel electrode 10 and has an aperture defining each pixel region may be formed on the planarizing film 112 to approximately correspond to the entire surface of the substrate 100.

According to an embodiment of the present invention, an organic light-emitting display apparatus for planarizing a thin film by solving non-uniformity of the thin film may be implemented. However, the scope of the present invention is not limited by this effect.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. An organic light-emitting display apparatus comprising:
a substrate;
   a pixel electrode disposed on the substrate;
   a pixel defining layer covering an edge of the pixel electrode to contact the pixel electrode directly and exposing at least a first portion of the edge of the pixel electrode;

a first intermediate layer disposed on the pixel electrode and covering a central part of the pixel electrode and the first portion of the pixel electrode;

an auxiliary insulating layer disposed on the first intermediate layer and covering a portion of the first intermediate layer corresponding to at least the first portion of the edge of the pixel electrode, the auxiliary insulating layer exposing the central part of the pixel electrode;

an emission layer disposed on the first intermediate layer corresponding to the central part of the pixel electrode to contact the first intermediate layer directly; and an opposite electrode facing the pixel electrode, the first intermediate layer interposed between the pixel electrode and the opposite electrode.

2. The organic light-emitting display apparatus of claim 1, further comprising a second intermediate layer, wherein the auxiliary insulating layer and the emission layer share a common top level, and wherein the second intermediate layer covers the emission layer and the auxiliary insulating layer.

3. The organic light-emitting display apparatus of claim 1, wherein the pixel defining layer has a pixel part that exposes the central part of the pixel electrode and a passage part that exposes the first portion of the pixel electrode.

4. The organic light-emitting display apparatus of claim 3, further comprising an adjacent pixel electrode that is adjacent to the pixel electrode,
wherein the passage part connects the central part of the pixel electrode and a central part of the adjacent pixel electrode.

5. The organic light-emitting display apparatus of claim 3, wherein the passage part has a curve shape.

6. The organic light-emitting display apparatus of claim 3, wherein the auxiliary insulating layer has an aperture that exposes the pixel part of the pixel defining layer.

7. The organic light-emitting display apparatus of claim 6, wherein the aperture of the auxiliary insulating layer shares a common inner side surface with the pixel part of the pixel defining layer.

8. The organic light-emitting display apparatus of claim 1, wherein the pixel defining layer exposes second, third, and fourth portions of the pixel electrode.

9. A method of manufacturing organic light-emitting display apparatus, the method comprising:
forming a pixel electrode on a substrate;
forming a pixel defining layer covering an edge of the pixel electrode to contact the pixel electrode directly and exposing at least a first portion of the edge of the pixel electrode;
forming a first intermediate layer on the pixel electrode and covering a central part of the pixel electrode and the first portion of the pixel electrode;
forming an auxiliary insulating layer on the first intermediate layer to cover a portion of the first intermediate layer corresponding to at least the first portion and exposing the central part of the pixel electrode;
forming an emission layer on the first intermediate layer to contact the first intermediate layer directly, the emission layer corresponding to the central part of the pixel electrode; and
forming an opposite electrode facing the pixel electrode, wherein the first intermediate later is interposed between the pixel electrode and the opposite electrode.

10. The method of claim 9, further comprising forming a second intermediate layer, wherein the auxiliary insulating layer and the emission layer share a common top level and the second intermediate layer is formed covering the emission layer and the auxiliary insulating layer.

11. The method of claim 9, wherein the forming of the pixel defining layer comprises forming a pixel part exposing the central part of the pixel electrode and a passage part that exposes the first portion of the pixel electrode.

12. The method of claim 11, wherein the forming of the pixel defining layer further comprises forming an adjacent pixel electrode that is adjacent to the pixel electrode, wherein the passage part connects the central part of the pixel electrode and a central part of the adjacent pixel electrode.

13. The method of claim 9, wherein the intermediate layer is formed by spin coating.

14. The method of claim 13, wherein the passage part is formed to have a curved shape along a direction where the intermediate layer is coated.

15. The method of claim 9, wherein the forming of the auxiliary insulating layer further comprises forming an aperture that exposes the pixel part of the pixel defining layer.

16. The method of claim 9, wherein the forming of the auxiliary insulating layer comprises forming an insulating layer so that the pixel part that exposes the central part of the pixel defining layer shares a common inner side surface with an aperture of the insulating layer.

17. The method of claim 9, wherein the forming of the pixel defining layer further comprises exposing second, third, and fourth portions of the pixel electrode.

18. An organic light-emitting display apparatus comprising:
a substrate;
a plurality of pixel electrodes disposed on the substrate;
a pixel defining layer having a plurality of islands disposed respectively covering portions of edges of the plurality of pixel electrodes to contact the pixel electrode directly;
a first intermediate layer disposed on the plurality of pixel electrodes and between the plurality of islands of the pixel defining layer;
an auxiliary insulating layer disposed on the first intermediate layer between at least the plurality of islands of the pixel defining layer, the auxiliary insulating layer exposing the central part of the pixel electrode;
an emission layer disposed on the first intermediate layer and corresponding to a central part of each of the plurality of pixel electrodes to contact the first intermediate layer directly; and
an opposite electrode facing the plurality of pixel electrodes, the first intermediate layer being disposed between the opposite electrode and the plurality of pixel electrodes.

19. The organic light-emitting display apparatus of claim 18, further comprising a second intermediate layer, wherein the auxiliary insulating layer and the emission layer share a common top level, and wherein the second intermediate layer covers the emission layer and at least a portion of the auxiliary insulating layer.

20. The organic light-emitting display apparatus of claim 18, wherein the pixel defining layer has a hexagonal shape.

* * * * *